United States Patent [19] [11] 3,912,983
Lowry, Jr. [45] Oct. 14, 1975

[54] HYBRID CIRCUIT HANDLING AND TESTING SYSTEM

[75] Inventor: Robert A. Lowry, Jr., Phoenix, Ariz.
[73] Assignee: Micro-Rel, Inc., Tempe, Ariz.

[22] Filed: Sept. 4, 1973
[21] Appl. No.: 394,152

[52] U.S. Cl. .................. 317/101 CC; 339/17 CF; 339/176 MP; 324/158 F
[51] Int. Cl.[2] .................. H05K 1/04
[58] Field of Search .............. 317/101 CC, 101 CP; 339/176 MP, 17 CF, 150 B; 324/158 F; 206/328, 329, 331; 174/DIG. 3

[56] References Cited

UNITED STATES PATENTS

| | | | |
|---|---|---|---|
| 3,391,383 | 7/1968 | Antes | 339/17 CF |
| 3,454,921 | 7/1969 | Coleman et al. | 324/158 F |
| 3,509,520 | 4/1970 | Cobban et al | 339/176 MP |

*Primary Examiner*—David Smith, Jr.
*Attorney, Agent, or Firm*—Lew Schwartz; Wayne A. Sivertson

[57] ABSTRACT

A hybrid circuit handling and testing system including a fixture adapted to accept the hybrid circuit. The fixture is provided with grooves each of which may accept a circuit lead, the grooves acting to hold the leads in a predetermined relationship to each other and the fixture. The circuit may be tested, repaired, stored and shipped in the fixture which is provided with a protecting cover. An aperture in the fixture provides access to the leads and the fixture may be inserted into a socket for testing, the socket having lead engaging contact members which contact the leads through the fixture aperture. A window in the fixture allows visual inspection and laser trimming.

4 Claims, 8 Drawing Figures

HYBRID CIRCUIT HANDLING AND TESTING SYSTEM

BACKGROUND OF THE INVENTION

The problems surrounding the testing, repair, storing and shipping of hybrid circuits are well known. In the testing stage, it is frequently necessary to move the circuit from one location to another. The fragile nature of the circuit and the fact that great care must be taken to prevent contamination often results in damage to the circuit from the handling. Additional damage commonly occurs during storing and shipment.

After assembly it is frequently necessary to "trim" the circuit to effect the proper electrical characteristics. Heretofore, hybrid circuits have been provided with a cover after assembly which cover had to be removed for any necessary trimming. The cover removal process frequently resulted in physical damage to the circuit components.

BRIEF SUMMARY OF THE INVENTION

The present invention provides a hybrid circuit fixture in which the test process may be performed. The fixture comprises a base includig a work-station which is adapted to receive the body of a hybrid circuit. A plurality of grooves in the base adjacent the work-station are adapted to accept the hybrid circuit leads. A protective cover is hingedly attached to the base, the hinges being of the type which provide a positive closure. Thus, with the cover in the open position, a hybrid circuit may be placed in the work-station of the base, and the cover closed and the packaged unit moved from one test location to another. The base is also provided with apertures which allow access to the circuit leads without opening the fixture or disturbing the circuit itself.

The present invention also provides a socket having lead engaging contact members within a recess which will accommodate the fixture when the base and cover are closed. The contact members may be suitably wired to testing equipment to thereby properly connect the circuit leads to the testing equipment upon insertion of the fixture into the socket. Should the testing indicate that laser trimming is required, this may be easily accomplished through a window in the cover, the fixture cover having eliminated the need to provide the hybrid circuit itself with a cover.

DETAILED DESCRIPTION OF THE DRAWINGS

Figure 1:
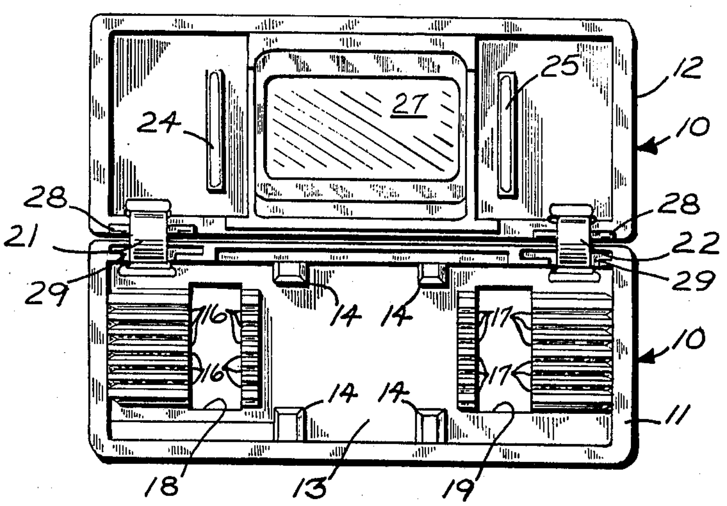
FIG. 1 illustrates the fixture of the present invention in the open position.

FIG. 1, which illustrates a preferred embodiment of a portion of the present invention, shows a fixture 10 formed of a base 11 and a cover 12. The base 11 has a central work-station 13 which is adapted to accept the body of a hybrid circuit. Bosses 14 are provided in the work station 13 to effect proper positioning of the hybrid circuit body. It will be recognized that circuit bodies come in various sizes and shapes and that work-station 13 can be conformed to any desired configuration. Extending from the work-station 13 are a first set of grooves 16 and a second set of grooves 17. The grooves 16 and 17 are formed within the base on projections from the base and are adapted to accept the leads of a hybrid circuit within the work-station 13, generally one lead per groove. In the embodiment illustrated in FIG. 1, the hybrid circuit would be a 12-lead circuit, six leads being within the grooves 16 and six leads being within the grooves 17. A aperture 18 interrupts the grooves 16 to provide access to the leads within the grooves 16 from the back of the base 11. Similarly, an aperture 19 interrupts the grooves 17 to provide access to the leads within those grooves.

The cover 12 is hingedly connected to the base 11 by means of hinges 21 and 22. The hinges 21 and 22 are of the well known spring-clamp type having a generally C-shape configuration with the ends of the hinges fitting into recesses in the base 11 and cover 12 respectively. This type of hinge has the capability of positively biasing the cover 12 in both the open and closed position so that it will maintain either position. Of course, other types of hinges may be employed consistent with the desired result of a positive closure such as that obtained through the use of the spring-clamp hinges. They may also be accomplished through the use of a locking mechanism although the positive closure capability of the spring-clamp hinge eliminates the need for such a mechanism in the embodiment shown in FIG. 1.

The cover 12 is provided with two bosses 24 and 25. These bosses project from the cover at a location such that they will project toward the apertures 18 and 19 when the cover 12 is in the closed position with respect to the base 11. The height of the bosses 24 and 25 is selected so that they will maintain the leads in the apertures 18 and 19. Also, when testing the hybrid circuit by access to the leads through the apertures 18 and 19, the bosses 24 and 25 will restrain the leads from movement away from the apertures 18 and 19.

A window 27 is provided in cover 12 for visual inspection and through which laser trimming of the hybrid circuit may be affected without opening cover 12. This eliminates any need to unduly expose the hybrid circuit to contaminates or the necessity to provide a cover for the hybrid circuit itself at this stage of the assembly and testing process. The window 27 may be of any suitable material known to the art and is held in place as by gluing to flanges in the cover 12. Of course, any suitable means of securement of the window 27 to the cover 12 may be employed, the particular method of securement forming no part of the present invention. The cover 12 is provided with ribs 28 which underlie the hinges 21 and 22 and cooperate with recesses 29 in base 11 to facilitate, in known manner, the pivotal movement of the cover 12 with respect to base 11. Additionally, the ribs 28 and recesses 29 provide a restraint against lateral movement between the cover 12 and base 11 when they are in the closed position.

Figure 2:
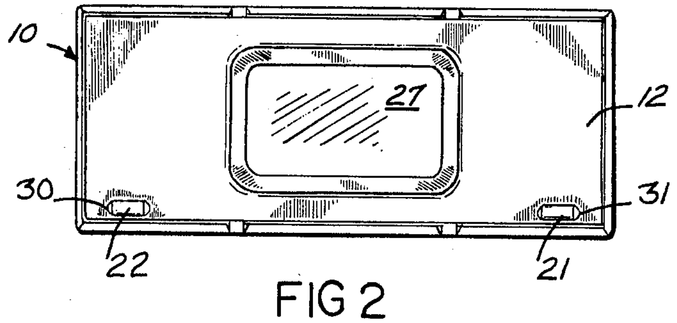
FIG. 2 illustrates the fixture of the present invention in the closed position as seen from the top.

Referring now to FIG. 2, there is shown the preferred embodiment of the fixture 10 of FIG. 1 with the cover 12 in the closed position. In this closed position, the window 27 overlies the work-station 13 thereby allowing visual inspection and laser trimming of a hybrid circuit in the work-station 13 through the window 27. The apertures 30 and 31 open to shoulders within the cover 12 with which the springs 21 and 22 cooperate in known fashion.

Figure 3:
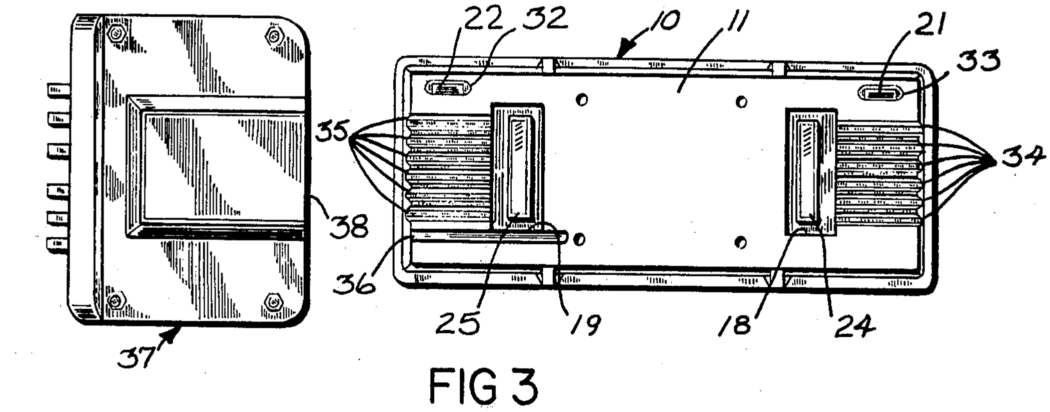
FIG. 3 illustrates a bottom view of the fixture and socket which comprise the handling and testing system of the present invention.

Referring now to FIG. 3 there is shown a bottom view of the fixture 10 in the closed position and adjacent a socket 37 with which the fixture 10 cooperates for testing. The bosses 24 and 25 are shown projecting toward the apertures 18 and 19. The height of the bosses 24 and 25 is such that they will contact a lead within the grooves 16 and 17 (see FIG. 1) to hold them in place. The bosses 24 and 25 will also restrain the movement of the leads away from the apertures 18 and 19 when access to the leads is occurring through the apertures 18 and 19. Apertures 32 and 33 within the base 11 open to shoulders with which the springs 21 and 22 cooperate in known manner.

The underside of the base 11, as illustrated in FIG. 3, are also provided with a plurality of grooves 34 and 35 as well as a slot 36. The grooves 34 and 35 function as guides for the electrical contact members in the socket 37 while the slot 36 provides a means for discriminating between a proper and improper insertion of the fixture 10 within the socket 37. The function of the grooves 34 and 35 and the slot 36 will become apparent from the discussion below.

Figure 4:
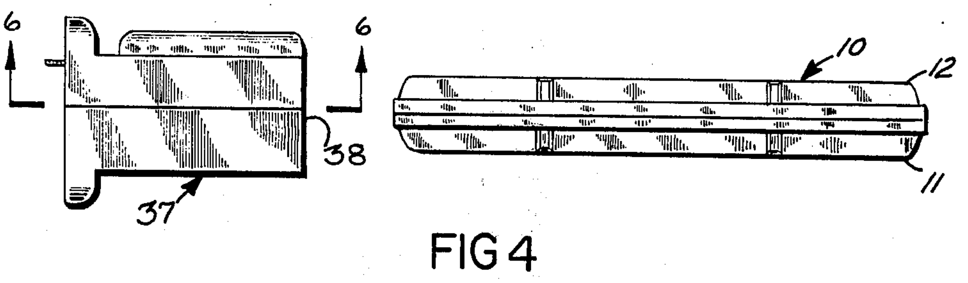
FIG. 4 shows a side view of the fixture and socket of FIG. 3.
Figure 5:
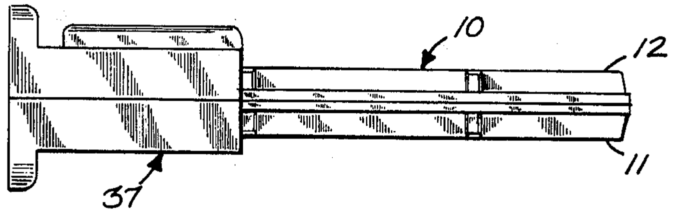
FIG. 5 shows the fixture and socket of FIG. 4 with the fixture within the recess of the socket.

Referring now to FIG. 4 there is shown a side view of the fixture 10 and socket 37 of FIG. 3. As can be seen, the base 11 and cover 12 are in a closed position, this position being necessary for an insertion of the fixture 10 into the socket 37. As stated above, the closed position is maintained through a positive closure accomplished through the spring-clamp hinges 21 and 22, although other types of closure maintaining systems may be employed. With the fixture 10 closed, and assuming a proper selection of fixture 10 and socket 37 as will be explained below, the fixture 10 may be at least partially inserted into a recess 38 in a socket 37. FIG. 5 illustrates the placement of the socket within the recess 38 of the fixture 37.

Figure 6:
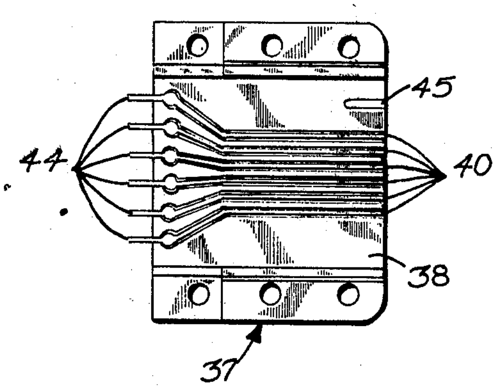
FIG. 6 shows a cross section of the socket of FIG. 4 along the line 6—6.

Referring now to FIG. 6, there is shown a cross section of the socket 37 taken along the line 6—6 of FIG. 4. As shown, a plurality of conductors 40 are within recess 38 of socket 37, the conductors serving as contact members for the leads within the grooves 16 and 17. The conductors 40 extend beyond the end of the socket 37 for the purpose of allowing electrical contact with the desired testing instrumentation. Each of the conductors 40 lie at least partially within one of a set of grooves 41 which open to the recess 38 (see FIG. 8). Upon insertion of the fixture 10 into the recess 38, the conductors 40 retract into the grooves 41 in a manner explained more fully below.

Figure 7:
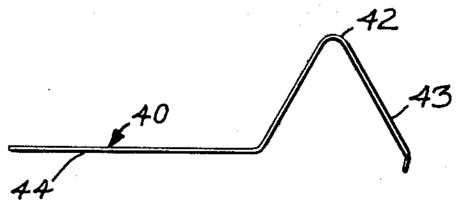
FIG. 7 illustrates a configuration of the socket lead contact members.
Figure 8:
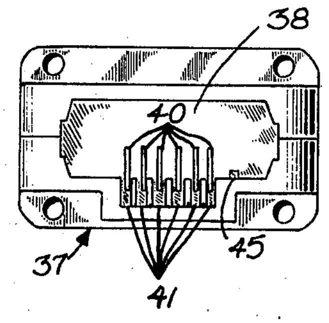
FIG. 8 shows a front view of the socket of the present invention.

The configuration of the contact members 40 is illustrated in FIG. 7. There, it can be seen that the members 40 include a relatively flat portion 44 which extends from outside the socket member 37 and include an arcuate portion 42 adapted to make electrical contact with the hybrid circuit leads. As illustrated in FIG. 8, the contact members 40 are spring biased such that the portion 42 extends from the grooves 41 into the recess 38 of the socket 37. When the fixture 10 is inserted into the recess 38 of the socket 37, the leading portion 43 of the members 40 act as a camming surface causing the members 40 to retract into the grooves 41. With the fixture 10 inserted sufficiently far to place the aperture 18 or 19 over the portion 42 of the contact member 40, the spring bias of the members 40 causes them to extend through the aperture and into contact with the leads of the hybrid circuit carried by the fixture 10. The grooves 41 in the socket 37 are positioned such that the contact members 40 will fall over a lead as positioned by the grooves 16 and 17 on the base 11. The grooves 34 and 35 also aid to guide the members 40 upon insertion of the fixture 10. The recess 38 is also provided with a key 45 which key projects into the recess 38 at a width, height and position so as to cooperate with the slot 36 thereby providing a means whereby a proper insertion of a fixture into the socket may be discriminated. That is, when the key 45 and slot 36 are in proper alignment for insertion, the key 45 will not prevent that insertion. However, a slot positioned other than that shown at 36 in FIG. 3, or, the absence of a slot, will cause the key 45 to prevent the insertion of the fixture 10 into the socket 37.

Obviously, many modifications and variations of the present invention are possible in light of the above teachings. For example, the fixture may be employed as both an assembly and testing fixture without the need to resort to the socket. The testing is facilitated by the positioning of the leads within the apertures 18 and 19 which allow ready access to them. Therefore, it is to be understood that, within the scope of the appended claims, the novel handling and testing system of the present invention may be practiced otherwise than as specifically described.

What is claimed is:

1. A hybrid circuit handling and testing system which comprises:

base means including work-station means adapted to receive the body of said hybrid circuit and groove means extending from said work-station means adapted to receive the leads of said hybrid circuit;

cover means including window means closed by a transparent member;

means hingedly connecting said cover means to said base means for pivotal movement about said base means between positive open and positive closed positions, said window means being positioned in said cover means to overlie said work-station means when said cover means is in said positive closed position;

lead access means in said base means comprising aperture means interrupting at least some of said groove means;

boss means projecting from said cover means toward said lead access means when said cover means is in said positive closed position for contacting a lead within said groove means to hold it in place while restraining movement of said lead away from said lead access means;

socket means having a recess configured to accept a portion of said base means and said cover means when said cover means is in said positive closed position;

groove means within said socket means recess; and spring biased means within said socket means recess and retractable into said socket means recess groove means, said spring biased means including a first portion lying at least partially within said groove means, a second portion angularly disposed relative to said first portion and forming contact means for extending through said lead access means to electrically contact a lead within said base means groove means and a third portion angularly disposed relative to said second portion and forming camming means for causing said spring biased means to retract into said socket means recess groove means when said contact means is not aligned with said lead access means aperture means.

2. The system of claim 1 wherein said base means further comprises means for guiding said extending means into contact with said hybrid circuit leads on insertion of said closed base means and cover means into said socket means recess.

3. The system of claim 2 wherein said socket means and said base means and cover means are provided with cooperating means for discriminating between a proper and improper insertion of a portion of housing base means and cover means into the socket means recess.

4. The system of claim 3 wherein said cooperating means comprise a key and slot.

* * * * *